(12) United States Patent
Despesse et al.

(10) Patent No.: US 7,808,766 B2
(45) Date of Patent: Oct. 5, 2010

(54) DEVICE WITH OPTIMISED CAPACITIVE VOLUME

(75) Inventors: Ghislain Despesse, Saint Egreve (FR); Jean-Jacques Chaillout, Saint-Etienne de Crossey (FR); Thomas Jager, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 479 days.

(21) Appl. No.: 11/917,810

(22) PCT Filed: Jul. 6, 2006

(86) PCT No.: PCT/EP2006/063980
§ 371 (c)(1),
(2), (4) Date: Dec. 17, 2007

(87) PCT Pub. No.: WO2007/006729
PCT Pub. Date: Jan. 18, 2007

(65) Prior Publication Data
US 2008/0192406 A1 Aug. 14, 2008

(30) Foreign Application Priority Data
Jul. 8, 2005 (FR) .................... 05 52111

(51) Int. Cl.
*H01G 5/01* (2006.01)
*H01G 5/00* (2006.01)
*H01G 4/005* (2006.01)

(52) U.S. Cl. .................... 361/278; 361/287; 361/303

(58) Field of Classification Search .................. 361/277, 361/278, 279, 287, 290
See application file for complete search history.

(56) References Cited

U.S. PATENT DOCUMENTS

| 2,266,057 | A | | 12/1941 | Massolle |
| 3,737,805 | A | * | 6/1973 | Shimodaira et al. ..... 331/116 R |
| 4,127,804 | A | | 11/1978 | Breaux |
| 4,653,326 | A | | 3/1987 | Danel et al. |
| 5,025,346 | A | | 6/1991 | Tang et al. |

(Continued)

FOREIGN PATENT DOCUMENTS

JP 2004221128 A * 8/2004

(Continued)

OTHER PUBLICATIONS

The search report for application No. PCT/EP2006/063980.

(Continued)

*Primary Examiner*—Eric Thomas
(74) *Attorney, Agent, or Firm*—Pearne & Gordon LLP

(57) ABSTRACT

A capacitive device comprising at least one first and one second comb, respectively provided with interdigital fingers, adapted to be mobile relative to each other depending on the closing-spacing apart of the axes of the fingers, at least one finger of the first comb including a face opposite a face of a finger of the second comb wherein the axis of the finger of the first comb and the axis of the finger of the second comb are inclined relative to a plane orthogonal to the first direction of displacement of the combs, the plane being defined by the second and third directions perpendicular to the direction, and perpendicular to each other.

23 Claims, 6 Drawing Sheets

U.S. PATENT DOCUMENTS

| | | | |
|---|---|---|---|
| 5,563,343 A | 10/1996 | Shaw et al. | |
| 5,640,133 A | 6/1997 | MacDonald et al. | |
| 5,901,031 A * | 5/1999 | Ishige et al. | 361/277 |
| 6,133,670 A | 10/2000 | Rodgers et al. | |
| 6,473,290 B2 * | 10/2002 | Mochida | 361/291 |
| 2003/0106372 A1 | 6/2003 | Adams et al. | |
| 2004/0246654 A1 | 12/2004 | Williams et al. | |
| 2005/0013087 A1 | 1/2005 | Wu et al. | |
| 2007/0188153 A1 | 8/2007 | Jager et al. | |
| 2008/0123242 A1 * | 5/2008 | Zhou | 361/290 |

FOREIGN PATENT DOCUMENTS

| | | |
|---|---|---|
| WO | 02-19509 | 3/2002 |
| WO | 0219509 A2 | 3/2002 |
| WO | 2007-006729 | 1/2007 |
| WO | 2007012663 A1 | 2/2007 |
| WO | 2007082894 A1 | 7/2007 |

OTHER PUBLICATIONS

Search report for French application No. 0552111.
International Search Report Dated Oct. 19, 2006.

* cited by examiner

DEVICE WITH OPTIMISED CAPACITIVE VOLUME

TECHNICAL FIELD AND PRIOR ART

This invention mainly provides a device with optimised capacitive volume, in particular used for producing accelerometers, gyrometers, and seismometers.

Capacitive devices comprise at least two interdigital capacitive combs forming a capacitor, one being generally fixed and the other mobile. Each comb comprises fingers which are disposed with clearance between the fingers of the other comb. The fingers of each comb are generally of rectangular form and are disposed between two fingers of the other comb which also delimit a space of rectangular form. The distance separating two directly adjacent fingers is called a gap.

These devices make it possible to convert a mechanical energy, the relative displacement of combs in relation to one another for example by vibration, into an electrical energy. These devices also make it possible to convert an electrical energy into a mechanical energy, by electrostatic effect. Thus by applying a potential difference between the fingers of two different combs, the displacement of one comb in relation to the other is caused.

It is particularly interesting to reduce the size of this type of device, since the latter makes it possible to increase the volume capacity of the conversion structure.

However, reducing the size of the device causes a decrease in the relative displacement between the combs, which, in the case of recovering vibration mechanical energy, causes a reduction in the energy that can be recovered.

Currently, electrostatic structures using the variation in the gap between two elements having a relative movement substantially according to a straight direction, comprise generally fingers that are orthogonal to the direction of displacement. However, the possibilities of increasing the volume capacity of this type of structure while retaining a large amplitude of displacement are limited. The fingers of each comb can be refined, but this thinning must take into account the strength of the fingers against stress, generated by the electrostatic force or the inertial force of the fingers themselves.

It is consequently a purpose of this invention to offer a capacitive device having an increased volume capacity for a given volume and amplitude of displacement.

DESCRIPTION OF THE INVENTION

The purpose mentioned above is accomplished thanks to a capacitive device comprising at least one first and one second combs comprising fingers of which the opposite faces are inclined relative to a plane orthogonal to the direction of displacement of the comb(s).

As such, the opposite faces are increased, which, for a same travel, makes it possible to have an increase in the volume capacity as well as an increase in the electrostatic force for a given voltage.

This invention advantageously makes it possible to reduce the influence of exterior parallel parasitic capacitances originating, for example, from management electronics, thanks to a higher capacity of the device.

This invention mainly concerns a capacitive device comprising at least one first and one second comb, respectively provided with interdigital fingers, said combs adapted to be mobile relative to each other depending on at least one first determined direction, at least one finger of the first comb including a face opposite a face of a finger of the second comb wherein said face of the finger of the first comb and said face of the finger of the second comb are inclined relative to a plane orthogonal to the first direction of displacement of the combs, the plane being defined by second and third directions perpendicular to the direction, and perpendicular to each other.

In a first embodiment, the faces of the fingers extend according to planes parallel to a plane containing the third direction.

In a second embodiment, the faces of the fingers are inclined relative to the second and third directions, i.e. the faces of the fingers extend according to planes that contain neither the second nor the third direction.

The faces of the fingers can also extend according to planes parallel to a plane containing the second direction, i.e. the faces of the fingers extend according to planes that do not contain the third direction.

In an example of an embodiment, the opposite faces of the fingers are parallel to each other.

The fingers can have a substantially rectangular section or a substantially trapezoidal section according to a plane parallel to a plane defined by the first and second directions.

Furthermore, each of the first and second combs can comprises a main body to which are connected, by one end, the fingers of the first and of the second combs respectively, the bodies then extending, for example, at least in part substantially according to an axis parallel to the first direction of displacement.

In a second example of an embodiment, the first comb comprises a substantially rectangular frame comprising fingers extending at an angle towards the inside of the frame and wherein the second comb comprises a main arm extending according to the first direction, with the fingers of the second comb extending at an angle from the main arm.

The second comb can also comprise a secondary arm perpendicular to the main arm and extending substantially according to the second direction, with the fingers of the second comb also extending at an angle from the secondary arm.

Advantageously, the device comprises a plane of symmetry containing the first direction and a plane of symmetry containing a second direction perpendicular to the direction.

In addition, at rest, the second comb can be decentred in relation to the first comb.

Advantageously, the combs have a relative displacement in the second direction.

Furthermore, the device according to this invention can comprise guiding means authorising the displacement of the second comb in relation to the first comb according to the first direction of displacement.

The guiding means can, for example, connect the ends of the main arm of the second comb to the frame of the first comb.

In an example of an embodiment, the frame comprises on the central portion of the large sides thereof, a finger having the form of a triangle and the secondary arm of the second comb comprises at each of the ends therein two fingers inclined relative to each other so as to define a space for receiving the finger of triangular form of the frame, opposite.

In an example of an embodiment, the fingers extend according to two planes so as to form chevrons.

In an alternative of an embodiment, the second comb comprises fingers extending from both sides of the main body, with the fingers of the second comb being interdigital with the fingers of the first combs arranged on both sides of the body and electrostatic mirrors are, advantageously, disposed between the fingers of the first comb and fingers of the second comb so as to allow for displacement of the second comb relative to the first comb according to a direction and the opposite direction thereof.

Advantageously, the first comb is fixed and the second comb is mobile relative to the first comb.

Furthermore, the first comb is, more preferably, electrically insulated from the second comb, for example by using an insulator substrate with which the first and second combs are assembled.

BRIEF DESCRIPTION OF THE DRAWINGS

This invention shall be better understood using the description which shall follow and the annexed drawings, in which.

DETAILED DESCRIPTION OF PARTICULAR EMBODIMENTS

In all of the figures, the faces of the fingers opposite were drawn plane in order to facilitate comprehension. But faces, for example concave/convex can also be considered, as well as disparate forms.

Figure 1:
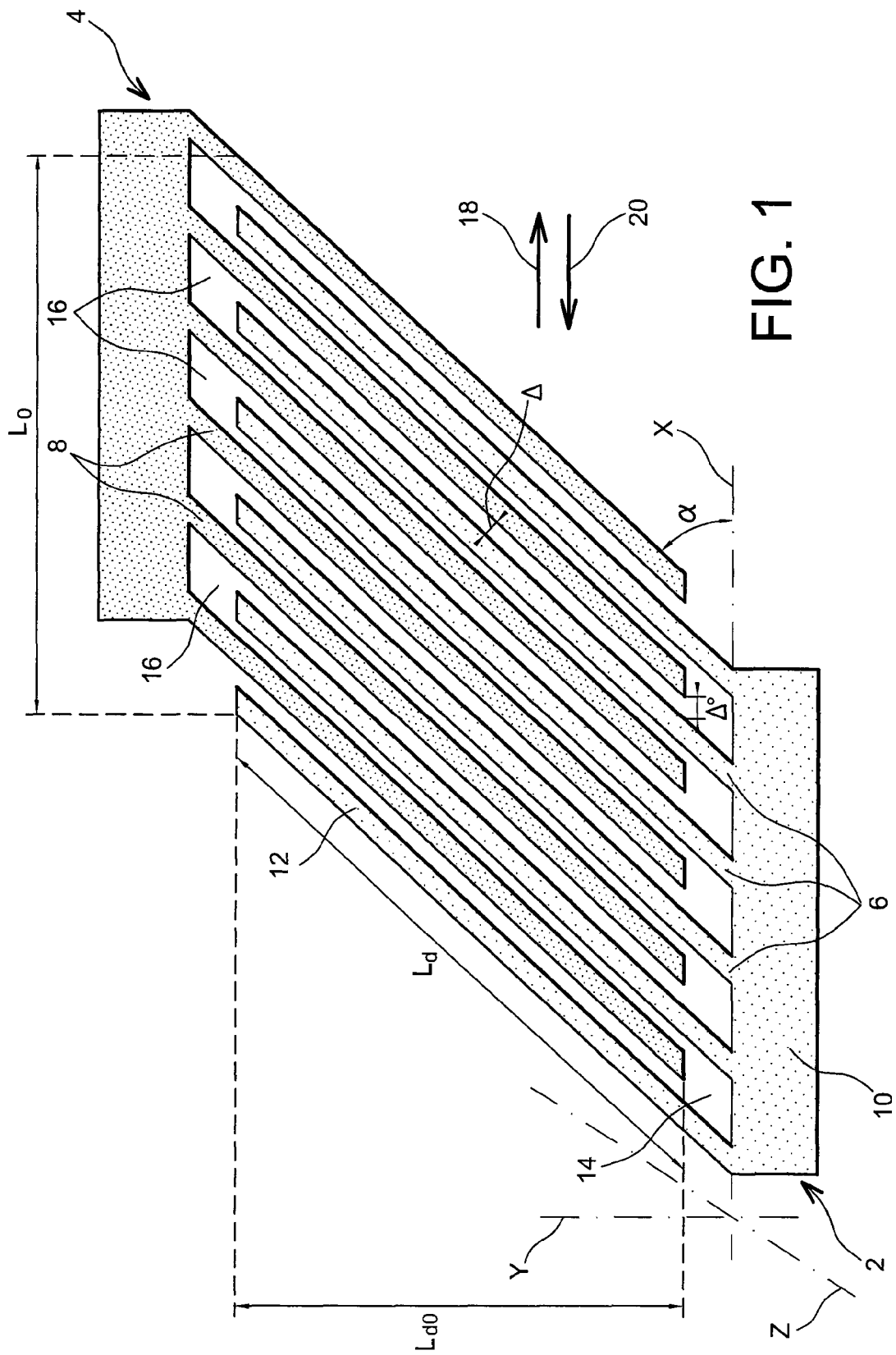
FIG. 1 is a schematic top view of a first example of a capacitive device according to a first embodiment of the invention.

In FIG. 1, a capacitive device is shown according to a first embodiment, comprising a first 2 and a second 4 combs comprising respectively fingers 6 and 8.

We shall describe comb 2 in detail, based on the knowledge that, in the example shown, the two combs 2,4 have substantially the same structure.

Comb 2 comprises a body 10 extending substantially according to a direction X, to which fingers 6 are fixed by an end.

The device according to this invention extends also according to a Y axis orthogonal to the X axis and contained in the plane of the sheet and according to a Z axis orthogonal to the X and Y axes.

Fingers 6 extend according to planes containing the Z axis and inclined relative to a plane defined by the Y and Z axes. The fingers are therefore inclined relative to a plane orthogonal to the direction X of displacement.

In the example shown, fingers 6 have a section according to a plane defined by the X and Y axes, in the form of a non-rectangular parallelogram, comprising large sides 12, advantageously parallel to each other, and define spaces 14 also in the form of a non-rectangular parallelogram.

The dimensions of the second comb are, in the example shown, substantially the same as those of the first comb 2. Fingers 8 are connected to a body 11 that is substantially parallel to body 10 and also define spaces 16 in the form of a non-rectangular parallelogram.

Fingers 8 are arranged in spaces 14, and reciprocally fingers 6 are arranged in spaces 16.

First and second combs 2, 4 have a relative movement according to direction X in a direction 18 or 20, the flanks of the fingers of the first comb closing in or moving apart from the flanks of the fingers of the second comb opposite. A single comb or both combs can be mobile.

The flanks of the fingers are contained, in the embodiment shown, in a plane inclined relative to a plane normal to direction X. The flanks thus form an angle α with direction X.

Advantageously, the flanks are contained in planes parallel between them, but this disposition is not limiting.

Combs of which the opposite faces are not parallel can be provided, however since the distance between the faces is not uniform along the latter, the travel is limited by the smallest gap distance.

The different dimensions of the device according to this invention can be defined according to angle of inclination α of the fingers with the following relationships.

$$\Delta = \Delta_0 \sin(\alpha)$$
$$l_d = \frac{l_{d0}}{\sin(\alpha)}$$
$$S = h l_d = \frac{h l_{d0}}{\sin(\alpha)} = \frac{S_0}{\sin(\alpha)}$$
$$C_{repos} = \frac{2\varepsilon_0 S}{\Delta} = \frac{2\varepsilon_0 S_0}{\Delta_0 \sin^2(\alpha)} = \frac{C_0}{\sin^2(\alpha)}$$
$$Q = Q_0 \Rightarrow F_e = \frac{Q_0^2}{2\varepsilon_0 \Delta_0 S_0} z \sin(\alpha) = F_{e0} \sin(\alpha)$$
$$V_{max} = V_{max0} \Rightarrow F_e \frac{V_{max0}^2 C_{repos}^2}{2\varepsilon_0 \Delta_0 S_0} z \sin(\alpha) = \frac{F_{e0}}{\sin(\alpha)}$$
$$F_e = F_{e0} \Rightarrow V_{max} = V_{max0} \sin^{\frac{3}{2}}(\alpha)$$

h being the thickness of the structure;

$l_d$ being the length of the fingers;

S being the lateral capacitive surface of a finger;

Δ being the gap thickness separating two interdigital fingers at rest;

Q being the charge stored on a finger;

Fe being the electrostatic force exerted by a finger according to X;

$C_{repos}$ ($C_{rest}$) being the value of the capacity as seen by a finger at rest (fingers equidistant from the two neighbouring fingers);

α being the angle formed by the capacitive surface of the fingers with the direction of displacement X, parameters indexed with "0" correspond to the standard case of non-inclined combs ($\alpha_0 = 90°$).

As such, in the case where angle α is equal to 45°, $$\alpha = 45° \Rightarrow \begin{vmatrix} \Delta = \dfrac{\Delta_0}{\sqrt{2}} \\ l_d = \sqrt{2}\, l_{d0} \\ S = \sqrt{2}\, S_0 \\ C_{repos} = 2C_0 \\ Q = Q_0 \Rightarrow F_e = \dfrac{F_{e0}}{\sqrt{2}} \\ V_{max} = V_{max0} \Rightarrow F_e = 2\sqrt{2}\, F_{e0} \\ E_{max} = E_{max0} \Rightarrow F_e = F_{e0} \\ F_e = F_{e0} \Rightarrow V_{max} = \dfrac{V_{max0}}{\sqrt{2\sqrt{2}}} \end{vmatrix}$$

For a capacitive device of the conventional type, for which α is equal to 90°, the following is obtained:

$$\alpha_0 = 90° \Rightarrow \begin{vmatrix} l_d = l_{d0} \\ S = S_0 \\ \Delta = \Delta_0 \\ Q = Q_0 \\ F_e = F_{e0} \\ C_{repos} = C_0 \end{vmatrix}$$

Selecting the angle is accomplished based on a compromise between the gain in the capacity and the mechanical constraints and required space. α is for example between 30° and 60°.

For a device according to this invention, it thus appears that the gap Δ is lower than in a device with teeth perpendicular to the direction of displacement. The voltage at which the charge is removed in order to obtain an electrostatic force equivalent to that obtained with a conventional device, is reduced by a factor of $\sin^{3/2}(\alpha)$.

Moreover, the capacity at rest is increased by a factor of $1/\sin^2(\alpha)$, which makes it possible to reduce the effect of parasitic capacitances.

Consequently, a device according to this invention has the same spatial encumbrance as a device according to prior art and offers increased capacity at rest and an increased electrostatic force for a given maximum voltage.

In the example shown, the fingers of a same comb are equidistant, but different distances between each finger of a same comb can be provided.

In FIG. 1, only two combs are shown for reasons of clarity, but the device can comprise more than two combs.

In the case of a device intended to generate a displacement between combs 2, 4, the latter are connected electrically to a voltage source (not shown) used to apply a voltage difference between the combs, in particular between a face of a finger of a comb and a face opposite a finger of the other comb, generating an electrostatic force between the two opposite faces. The electrical power supply is managed for example by an electronic unit.

In the case of a device for converting the mechanical movement between the two combs into an electrical energy, the combs are connected to an electronic unit used to convert a variation in capacity into an electrical energy. In the case of a device for measuring acceleration, the combs are connected to an electronic circuit that makes it possible to measure the variation in capacity and via this, acceleration.

Combs 2 and 4 are advantageously electrically insulated from each other so as to avoid any short circuit in case they come into contact with one another.

An electrical insulation between the mobile combs in relation to the fixed combs can be obtained by assembly on an insulator.

Figure 2:
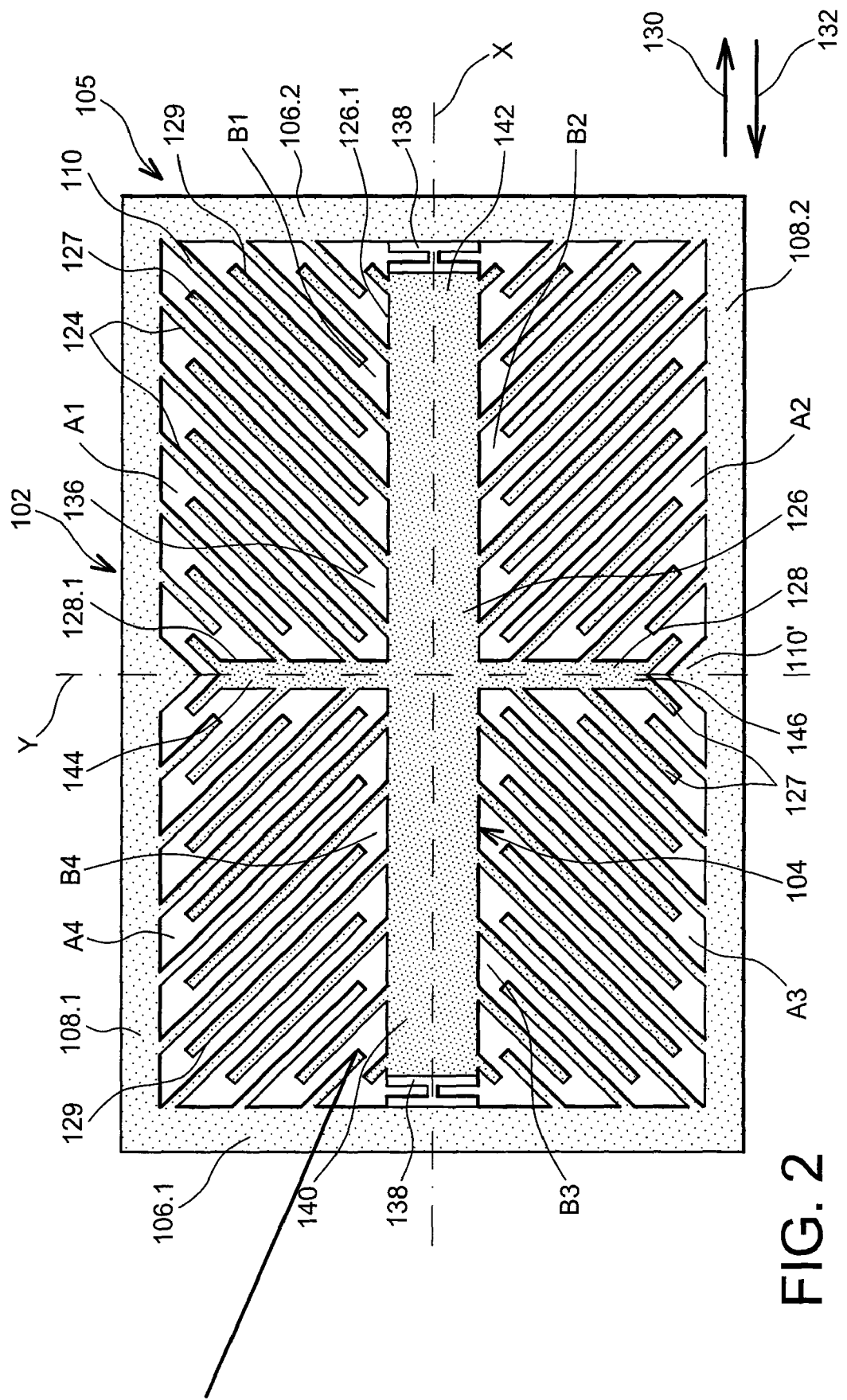
FIG. 2 is a schematic top view of a capacitive device according to a second example of the first embodiment of the invention.

In FIG. 2, a second example of an embodiment of a device is shown according to the first embodiment of this invention, wherein the inclination of the flanks of the fingers can vary from one finger to another.

The device in FIG. 2 comprises a first fixed comb 102 and a second mobile comb 104 arranged inside the first comb.

First comb 102 comprises a frame 105 of substantially rectangular form formed of two small sides 106.1, 106.2 and two large sides 108.1, 108.2.

The first comb comprises fingers 110 distributed according to four zones A1, A2, A3, A4.

Zones A1 to A4 are delimited by the small sides 106.1, 106.2, large sides 108.1, 108.2, and the X and Y axes, and form four rectangles of the same dimensions.

In each zone A1 to A4, fingers 110 extend according to a particular direction.

We shall describe zone A1, with zones A2 to A4 being, in the example shown, of equivalent structure.

Fingers 110 extend from the small and large sides towards the interior of frame 105, according to a disposition at an angle.

Fingers 110 comprise flanks 124, in the example shown parallel to each other and are inclined according to an angle α in relation to the X axis.

Flanks 124 delimit spaces receiving fingers 127 of the second comb 104.

Fingers 110 of zone A3 have the same orientation as that of fingers 110 of zone A1.

In the example shown, fingers 110 of zones A2 and A4 are inclined by an angle 180°-α in an anticlockwise direction. As such zones A1 and A4 are symmetric in relation to a plane passing through the Y axis and orthogonal to the plane of the sheet, as well as zones A2 and A3.

Second comb 104 substantially has the form of a cross, comprising a main branch 126 arranged according to the X axis and a secondary branch 128 of the Y axis, substantially perpendicular to main branch 126.

Second comb 104 is mobile according to the X axis in a direction 130 and 132.

Branches 126, 128 of the second comb 104 delimit four zones B1 to B4 covering zones A1 to A4 respectively and wherein fingers 127 have a particular disposition adapted to the disposition of fingers 110 in zones A1 to A4 respectively.

We shall describe zone B1, with zones B2 to B4 being of equivalent structure.

Fingers 127 extend at an angle from half-branches 126.1 and 128.1 towards the exterior of the cross. Flanks 129 of fingers 127 are inclined according to an angle α in relation to the X axis and delimit spaces 136 to receive fingers 110 of zone A1.

As such, in the example shown, flanks 129 of fingers 127 are parallel to flanks 124 of fingers 110.

In the example shown, with all of the flanks 124 and 129 of a same zone being parallel to each other, we speak indifferently of the inclination of fingers or of flanks.

On the other hand, in the particular case shown in FIG. 2, the fingers of zones A1 and A4, and of zones A2 and A3 are parallel to each other. But the cases of different orientations for the fingers of each zone A1 to A4 associated to zones B1 to B4 respectively, are not beyond the scope of this invention.

In the example shown, α is equal to 45°.

The device according to FIG. 2 also comprises guiding means 138 of the displacement of the second comb 104 in relation to the first comb 102.

These means 138 connect advantageously the ends 140, 142 of the main branch 126 to the smallest sides 106.1, 106.2 opposite.

These means are either insulated electrically, or fixed to an insulator support in order to electrically insulate combs 102 and 104.

Means 138 are, for example formed by swivels, springs, etc.

The second comb 104 can for example be set into movement in relation to first comb 102 by a mechanical drive system, or via mechanical vibrations applied to an external element, the vibrations can then be applied to comb 104 by the intermediary of flexible mechanical links connecting comb 104 to the external element. These means of a spring type can be made from silicon in the form of engraved beams, or from metal or from an elastic material (spring, rubber). These means can also have a guiding function of displacement of the combs in relation to one another.

This device can for example make it possible to convert an energy generated by a mechanical movement into electrical energy via an electrostatic method.

It is, moreover, possible to use this device as a mechanical actuator by applying a potential difference between the two combs.

Note that, if in rest position, the second comb 104 is centered in relation to the first comb 102, the electrostatic force is zero in central position due to the symmetry of the device, it is therefore not possible to displace comb 104 in relation to comb 102. In order to allow comb 104 to be set in movement, modifying the relative position of combs 102 and 104 at rest can be provided, for example by shifting comb 104 in relation to comb 102 at rest, in such a way that the device is not symmetric at rest.

In the example shown, fingers 127 arranged at ends 144, 146 of the secondary branch 126 of both sides of the branch, are perpendicular to each other and form a substantially triangular space, receiving a finger 110' arranged in the central portion of a large side 108.1,108.2, advantageously of substantially triangular form.

The fingers of second comb 104 are distributed symmetrically in relation to secondary branch 128, which makes it possible to distribute the electrostatic forces and masses applied to comb 104 symmetrically.

Figure 3:
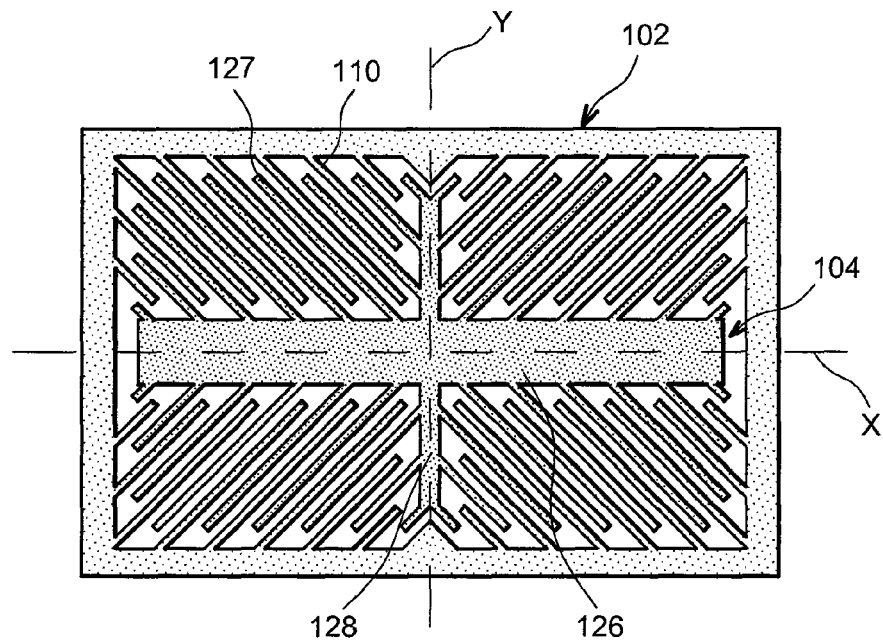
FIG. 3 is an alternative of the embodiment of the device in FIG. 2.

In FIG. 3, an alternative is shown of the embodiment of the device shown in FIG. 2, wherein the second comb 104 can be moved according to several directions, advantageously according to the X and Y axes.

Second comb 104 is then suspended in relation to first comb 102 via means that are not shown.

This is particularly interesting when one desires to recover the vibration energy in a complex medium comprising several sources of vibration of different directions and/or a random source of direction.

The capacitive behaviour of the device during a displacement according to the Y axis is substantially identical to the capacitive behaviour during a displacement according to the X axis. The behaviours in the two X and Y directions are as close as the angle of the fingers in relation to the X axis is close, in absolute value, to 45°. This device is therefore advantageously adapted for use in any environment.

In the case where a greater amplitude of relative displacement according to a direction is provided, it is then possible to optimise the device by selecting an angle of inclination of the fingers adapted to the direction of a higher amplitude of vibration, for example a lower angle will be chosen in relation to the X axis, for a greater amplitude of displacement according to X in relation to the amplitude according to Y.

Figure 4:
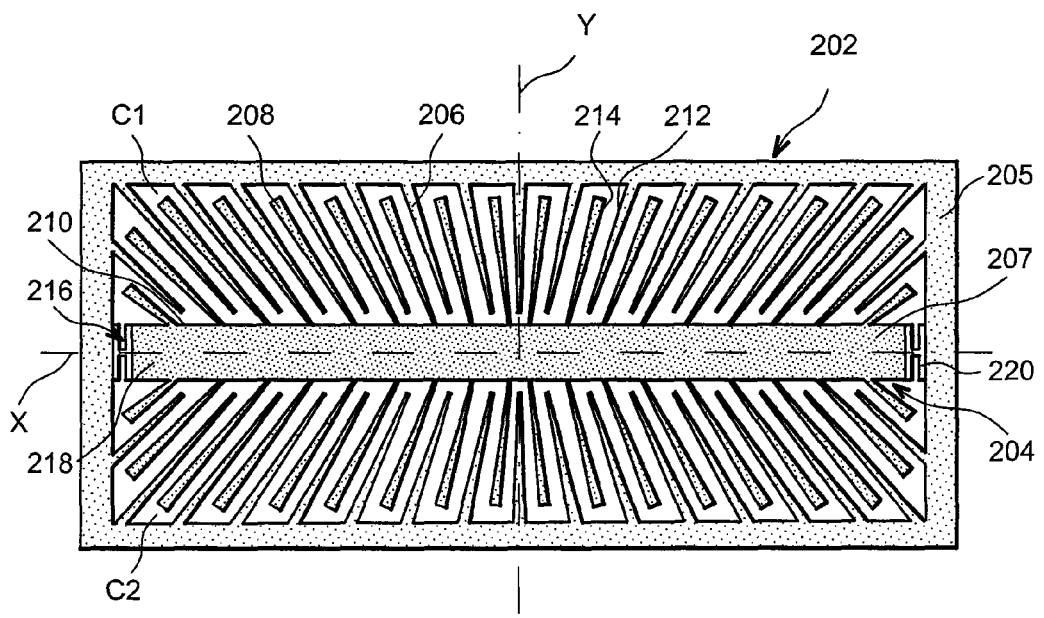
FIG. 4 is a schematic top view of a capacitive device according to a second alternative of the second example of the first embodiment of the invention.

In FIG. 4, another alternative is shown of a device according to the first embodiment, wherein the inclination of the fingers varies progressively across the entire extent of the device, which makes it possible to fully occupy the device.

As with the devices in FIGS. 2 and 3, the device according to FIG. 4 comprises a first comb 202 forming a frame and a second comb 204 arranged inside the first comb 202.

In the example shown, the first comb 202 comprises a rectangular frame 205.

The first comb can have any other form adapted to a specific environment and to an available volume, for example it can be circular, elliptic, a chevron or have any other form.

In addition, the first comb does not necessarily have the form of a closed frame 205.

The second comb 204 is formed by a single branch 207 of the X axis.

The first 202 and the second 204 combs comprise respectively interdigital fingers 206, 208.

The first comb 202 comprises a first zone C1 and a second zone C2, in the example shown, symmetric in relation to the X axis In zone C1, the fingers 206 extend from an inner wall of frame 205 towards the interior of the frame. The fingers 206 are inclined in relation to the X axis by an angle α. In the embodiment shown, the angle of inclination α of the fingers increases between 0° and 180° in an anticlockwise direction.

In FIG. 4, it can be seen that fingers 206 are arranged symmetrically in relation to a plane orthogonal to the sheet and containing the Y axis. But this is not limiting and a different distribution can be provided without a plane of symmetry.

Comb 204 is also symmetric in relation to a plane orthogonal to the sheet and passing through the X axis.

Fingers of comb 204 extend from one side 210 of branch 207 in zone C1 of the first comb and are distributed across the entire length of side 210 with an angle of inclination varying increasingly, between 0° and at most 180° in an anticlockwise direction.

The distribution of fingers 208 is such that fingers 208 are disposed between fingers 206 of the first comb 202.

Advantageously, flanks 212,214 of fingers 206,208 respectively opposite are parallel, authorising identical relative displacement according to the direction of the displacement.

The fingers thus have, seen from above, a substantially trapezoidal profile so as to ensure parallelism of the flanks.

The distribution of fingers 206 and 208 in zone C2 is symmetric, as described above.

The device also comprises guiding means 216 of the displacement of the second comb 204 in relation to the first comb 202. These means 216 connect advantageously ends 218,220 of branch 207 to the smallest sides of frame 205.

In the example shown the relative movement of the two combs 202,204 is accomplished according to the X axis, but, as for the device in FIG. 3, a relative movement according to several directions, in particular according to the X and Y axes, can be provided.

As described above, the symmetric disposition of the fingers is in no way limiting, and any inclined distribution of the fingers that allows for sufficient amplitude between the combs is suitable.

Furthermore, the disposition of the guiding means can be different and connect, for example, the second comb to the large side of the first comb.

In this embodiment, the fingers benefitting the most from the advantages of this invention are those which are the most inclined in relation to the plane orthogonal to the displacement, i.e. to the plane orthogonal to the X axis.

It is therefore possible by inclining the fingers, to optimise the number of fingers for a given volume.

Figure 5:
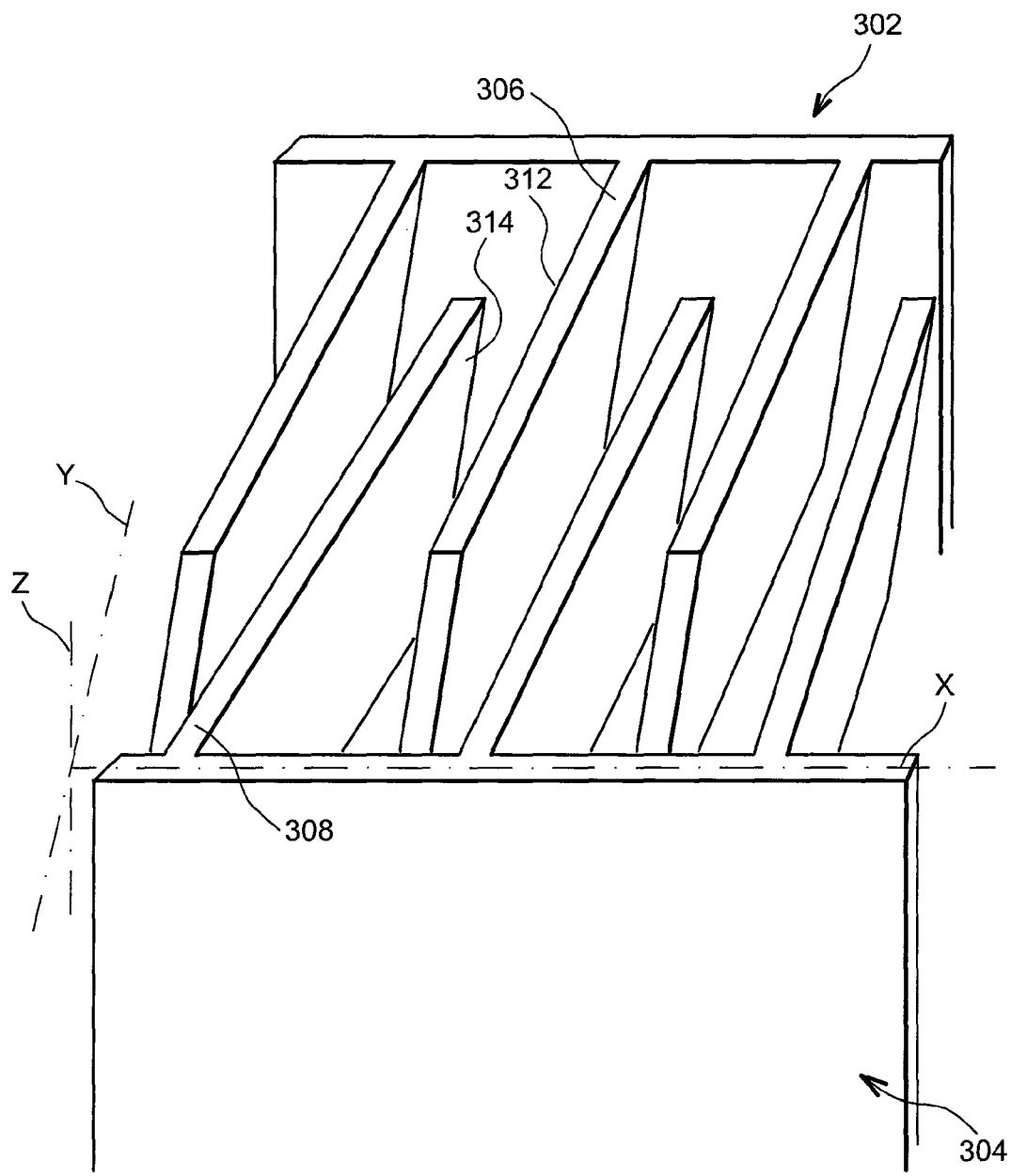
FIG. 5 is a perspective view of a detail of a second embodiment of a device according to this invention.

FIG. 5 is a perspective view of a second particular embodiment of a device according to this invention.

The device according to FIG. 5 comprises a first comb 302 and a second comb 304 comprising respectively interdigital fingers 306, 308.

The combs can have a relative movement according to a first direction X and a second direction Y, perpendicular to each other and contained in the plane of the sheet. The combs extend also according to a direction Z perpendicular to X and Y.

The fingers are, in the example shown, substantially flaty and extend according to a plane that is inclined in relation to a plane defined by the directions Y and Z as well as in relation to direction Z.

The fingers contained in planes parallel to plane YZ and inclined in relation to the direction Z, are not beyond the scope of this invention.

In the example shown, fingers 306, 308 comprise flanks 312, 314 respectively opposite, parallel to each other.

Flanks 312, 314 that are not parallel can also be provided.

Combs 302, 304 can have a relative movement according to the X and/or Y axis.

Such a disposition of the fingers can also be applied to the devices in FIGS. 2 to 3.

Figure 6:
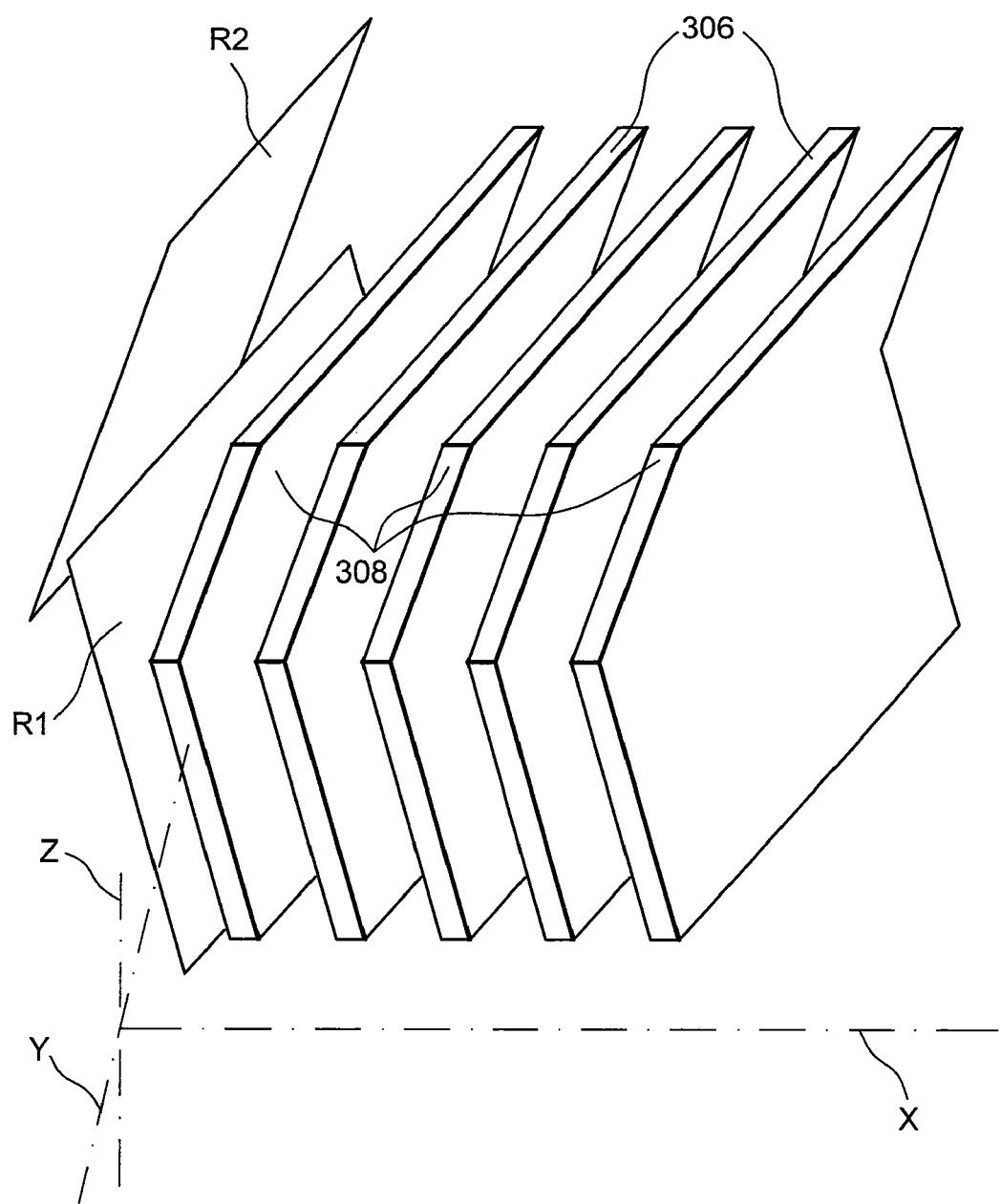
FIG. 6 is an alternative of the embodiment of the device in FIG. 5.

In FIG. 6, an alternative is shown of the device in FIG. 5, wherein fingers 306, 308 no longer extend through a single plane but through two secant planes, parallel to planes R1, R2, each plane R1, R2 being inclined in relation to the plane defined by Y and Z, and in relation to Z.

In the example shown, planes R1 and R2 are arranged so as to form a chevron. As such the fingers have a plane of symmetry parallel to a plane defined by the X and Y axes.

This particular embodiment makes it possible advantageously to increase the strength of the fingers to the stress implied by the electrostatic forces and the inertia proper to the fingers, while optimising the capacitive volume.

Figure 7:
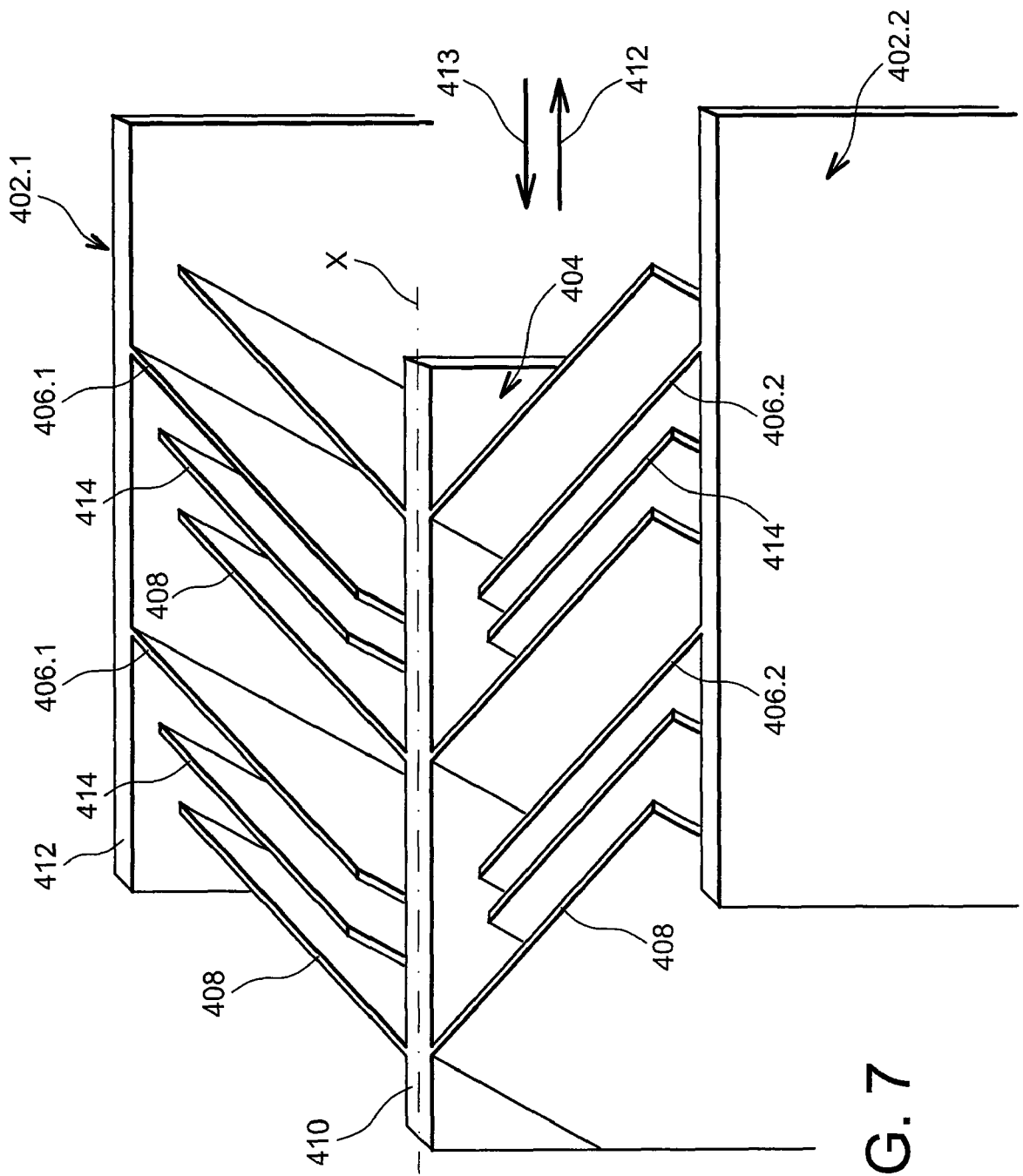
FIG. 7 is a perspective view of a device incorporating the detail in FIG. 5.

In FIG. 7, a device is shown incorporating the particular form of the combs in FIG. 5.

The device comprises a mobile comb 404 and one first and one second fixed combs 402.1, 402.2.

Comb 404 comprises a central body 410 extending according to an X axis and fingers 408 arranged on both sides of body 410 according to the disposition of FIG. 5, in the form of a fir tree.

Combs 402.1 and 402.2 are substantially identical, we shall describe comb 402.1.

Comb 402.1 comprises a body 412 extending longitudinally according to an axis parallel to the X axis and fingers 406.1 arranged as in FIG. 5 and coming to be disposed between fingers 408 projecting from a side of body 410.

Fingers 406.2 of comb 402.2 are arranged in the same manner on the other side of body 410.

Advantageously, the device also comprises electrostatic mirrors 414 disposed between each pair formed by a finger 408 and a finger 406.1 of one side of the body 410 and a finger 408 and a finger 406.2 of the other side of body 410, in a direction indicated by arrow 412.

An electrostatic mirror 414 makes it possible to limit, even cancel the electrostatic force that is applied between the two fingers that it separates. As such, if mirrors 414 are set to the potential of comb 404, there is no longer any force applied on the side of the fingers of comb 404 located opposite an electrostatic mirror 414. The dissymmetry of the device makes it possible to generate a mechanical stress in a direction 412 or in a direction 413 opposite to direction 412.

Electrostatic mirrors 414 are also connected to an electrical source which can be the same as that of combs 402, 404 or an independent source.

We shall now explain the operation of such a device:
when an electrical voltage difference is applied between combs 402.1 and 404, an electrostatic force is applied to comb 404 in directions 413,
when an electrical voltage difference is applied between combs 402.2 and 404, an electrostatic force is applied to comb 404 in direction 412.

The device according to FIG. 7, makes it possible advantageously to create a mechanical force in a direction 412 or in an opposite direction 413 regardless of the position although for the devices shown in FIGS. 1 to 5, the electrostatic force, for a given position, only applies in one direction.

The electrostatic mirrors can also be disposed between a pair of fingers 408 and 406.1 or 406.2 in direction 413.

Comb 402.1 and/or comb 402.2 can also be mobile. A fixed comb 404 and mobile combs 402.1, 402.2 can also be provided.

Providing fingers extending according to planes that are not parallel to each other, with the particular dispositions of the fingers of the devices in FIGS. 2 and 3 also being applicable, can also be considered.

Devices in FIGS. 2 and 3 comprising electrostatic mirrors are not beyond the scope of this invention.

The faces of the fingers opposite are not necessarily planar; the corresponding forms of the opposite faces can be for example undulated or saw toothed.

We have indeed produced a device with optimised capacitive volume, since the inclination of the fingers makes it possible to increase the mechanical force exerted on the mobile comb for a given applied voltage and volume.

The device according to this invention can be produced for example via machining in a solid conductive material or comprising a metallic coating, the material may be of tungsten, silicon dope, a metallised ceramic or plastic.

The return means of the device at rest, of the return spring type in the form of a flexible beam, can also be directly produced by machining in the solid material.

The manufacture of this device can also be carried out by conventional microelectronic technologies, for example via deep etching (DRIE), gluing on insulant (glass).

The methods currently used to manufacture electrostatic accelerometers are also applicable.

Producing these devices via moulding and/or gluing can also be considered.

The devices according to this invention can be used in accelerometers, gyrometers and seismometers and in any device using capacity variation via gap variation.

The invention claimed is:

1. Capacitive device comprising at least first and second combs, equipped respectively with interdigital fingers, said combs able to be mobile in relation to one another according to at least one first determined direction depending on the closing-spacing apart of the axes of the fingers, at least one finger of the first comb including a face opposite a face of a finger of the second comb wherein the axis of the finger of the first comb and the axis of the finger of the second comb are inclined relative to a plane orthogonal to the first direction of displacement of the combs, the plane being defined by second and third directions perpendicular to the first direction, and perpendicular between themselves.

2. Device according to claim 1, wherein the faces of fingers extend according to planes parallel to a plane containing the third direction.

3. Device, according to claim 1, wherein the faces of the fingers extend according to planes parallel to a plane containing the second direction.

4. Device according to claim 1, wherein the faces of the fingers are inclined relative to the second and third directions.

5. Device according to claim 1, wherein the faces of the fingers opposite are parallel to each other.

6. Device as according to claim 1, wherein the fingers have a substantially rectangular section according to a plane parallel to a plane defined by first and second directions.

7. Device as according to claim 1, wherein the fingers have a substantially trapezoidal section according to a plane parallel to a plane defined by first and second directions.

8. Device as according to claim 1, wherein each of the first and second combs comprises a main body to which are connected by one end the fingers of the first and of the second combs respectively.

9. Device according to the preceding claim, wherein the bodies extend at least in part substantially according to an axis parallel to the first direction of displacement.

10. Capacitive device comprising at least first and second combs, equipped respectively with interdigital fingers, said combs able to be mobile in relation to one another according to at least one first determined direction depending on the closing-spacing apart of the axes of the fingers, at least one finger of the first comb including a face opposite a face of a finger of the second comb wherein the axis of the finger of the first comb and the axis of the finger of the second comb are inclined relative to a plane orthogonal to the first direction of displacement of the combs, the plane being defined by second and third directions perpendicular to the first direction, and perpendicular between themselves, and wherein the first comb comprises a substantially rectangular frame comprising fingers extending at an angle towards the interior of the frame and wherein the second comb comprises a main arm extending according to the first direction, the fingers of the second comb extending at an angle from the main arm.

11. Device according to the preceding claim, wherein the second comb also comprises a secondary arm perpendicular to main arm and extending substantially according to the second direction, the fingers of the second comb extending also at an angle from secondary arm.

12. Device according to the preceding claim, comprising a plane of symmetry containing the first direction and a plane of symmetry containing a second direction perpendicular to the first direction.

13. Device as according to claim 10, comprising guiding means authorising the displacement of the second comb in relation to the first comb according to the first direction of displacement, and wherein guiding means connect ends of the main arm of the second comb to the frame of the first comb.

14. Device according to claim 10, 11, 12 or 13, wherein the frame comprises on the central portion of the large sides therein, a finger having the form of a triangle, and wherein the secondary arm of the second comb comprises at each end therein two fingers inclined in relation to each other so as to define a space to receive the finger of triangular form of the frame, opposite.

15. Capacitive device comprising at least first and second combs, equipped respectively with interdigital fingers, said combs able to be mobile in relation to one another according to at least one first determined direction depending on the closing-spacing apart of the axes of the fingers, at least one finger of the first comb including a face opposite a face of a finger of the second comb wherein the axis of the finger of the first comb and the axis of the finger of the second comb are inclined relative to a plane orthogonal to the first direction of displacement of the combs, the plane being defined by second and third directions perpendicular to the first direction, and perpendicular between themselves, and wherein the second comb comprises fingers extending from both sides of the main body, the fingers of the second comb being interdigital with fingers of the first combs, arranged on both sides of the body.

16. Device according to the preceding claim, comprising electrostatic mirrors disposed between fingers of the first comb and fingers of the second comb so as to allow for a displacement of the second comb in relation to the first comb according to a direction and the opposite direction thereof.

17. Device as according to claim 1, 10 or 15, wherein at rest the second comb is decentred in relation to the first comb.

18. Device as according to claim 1, 10 or 15, wherein combs have a relative displacement in the second direction.

19. Device as according to claim 1, 10 or 15, comprising guiding means authorising the displacement of the second comb in relation to the first comb according to the first direction of displacement.

20. Device as according to claim 1, 10 or 15, wherein fingers extend according to two planes so as to form chevrons.

21. Device as according to claim 1, 10 or 15, wherein the first comb is fixed and the second comb is mobile in relation to the first comb.

22. Device as according to claim 1, 10 or 15, wherein the first comb is electrically insulated from the second comb.

23. Device according to the preceding claim, wherein the first and second combs are assembled with an insulating substrate.

* * * * *